(12) United States Patent
Steinmann et al.

(10) Patent No.: US 7,039,888 B2
(45) Date of Patent: May 2, 2006

(54) MODELING PROCESS FOR INTEGRATED CIRCUIT FILM RESISTORS

(75) Inventors: Philipp Steinmann, Richardson, TX (US); Amitava Chatterjee, Plano, TX (US); Doug Weiser, Plano, TX (US); Roland Bucksch, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 10/728,068

(22) Filed: Dec. 4, 2003

(65) Prior Publication Data

US 2005/0124079 A1   Jun. 9, 2005

(51) Int. Cl.
  *G06F 9/45*  (2006.01)
  *G06F 17/50*  (2006.01)

(52) U.S. Cl. ................ 716/5; 702/133; 702/182; 703/14

(58) Field of Classification Search ........... 716/1–5; 703/14, 3–5; 702/138, 182

See application file for complete search history.

(56) References Cited

U.S. PATENT DOCUMENTS 6,497,824 B1   12/2002   Chen et al.

OTHER PUBLICATIONS

Lane et al., The Design of Thin-Film Polysilicon Resistors for Analog IC applications, Apr., 1989, IEEE Transactions on Electron Devices, vol. 36, No. 4, pp. 738-744.*
Richard et al., Thermal Properties of Very Fast Transistors, Augustl, 1970, IEEE Transactions on Electron Devices, vol. 17, No. 8, pp. 586-594.*
Chung et al., Junction-to-Top and Junction-to-Board Thermal Tesistance- Measurement for 119 BGA Packages, May, 1999, Fifteenth IEEE SEMI-THERM Symposium, p. 142-150.*
Pence et al., Package Thermal Resistance: Geometric Effect in Convention and Hybrid Packages, Jun., 1990, IEEE Transactions on Components, Hybrids, and Manufacturing Technology, vol. 13, No. 2 p. 586-594.*
"Characterization of Bolometers Based on Polycrystalline Silicon Germanium Alloys", S. Sedky, P. Fiorini, M. Caymax, C. Baert, L. Hermans and R. Mertens, IEEE Electron Device Letters, vol. 19, No. 10, Oct. 1998, pp. 376-378.

(Continued)

*Primary Examiner*—A. M. Thompson
*Assistant Examiner*—Nghia M. Doan
(74) *Attorney, Agent, or Firm*—Peter K. McLarty; W. James Brady, III; Frederick J. Telecky, Jr.

(57) ABSTRACT

A method is presented, in which a thin film resistor is modeled to account for self-heating. The method includes fabricating the thin film resistor and characterizing a thermal resistance of the thin film resistor, wherein the thermal resistance accounts for self-heating thereof during operation. The thermal resistance is then used in a model for simulating integrated circuits using the thin film resistor.

14 Claims, 5 Drawing Sheets

OTHER PUBLICATIONS

"Analysis of Distributed Resistance Effects in MOS Transistors", John Horan, Colin Lyden, Alan Mathewson, Ciaran C. Cahill and W. A. Lane, IEEE Transactions on Computer Aided Design, vol. 8, No. 1, Jan. 1989, pp. 41-45.

"A Technique for Electrically Measuring the Termal Resistance of GaAs Bulk Resistors", Edwin Sabin, John Scarpulla, Yeong-Chang Chou and Gene Shimamoto, GaAs Reliability Workshop, 2000, Proceedings, pp. 65-69.

"Heat Transport In Thin Dielectric Films", S.M. Lee and David G. Cahill, J. Appl. Phys., American Institute of Physics, vol. 81, Mar. 1997, pp. 2590-2595.

"Effect of Thickness on the Transverse Thermal conductivity of Thin Dielectric Films", A.J. Griffin, Jr., F.R. Brotzen, and P.J. Loos, J. Appl. Phys., American Institute of Physics, vol. 75, Apr. 1994, pp. 3761-3764.

"Integration of Thin Film MIM Capacitors and Resistors into Copper Metallization Based RF-CMOS and Bi-CMOS Technologies", Peter Zurcher, Prasad Alluri, Peir Chu, Alain Duvallet, Chris Happ, Rashaunda Henerson, John Mendonca, Matthew Kim, Michael Petras, Mark Raymond, Tom Remmel, Doug Roberts, Bob Steimle, Jim Stipanuk, Sherry Straub, Terry Sparks, Marc Tarabbia, Helene Thibieroz and Mel Miller, Electron Devices Meeting, 2000, IEDM Technical Digest International, 2000, pp. 153-156.

*Temperature Variation*, "The Art of Analog Layout", A. Hasting, Prentice Hall, 1st Edition, Dec. 2000, P. 164.

"Thermal Properties of Very Fast Transistors", Richard C. Joy and E.S. Schlig, IEEE Transactions on Electron Devices. vol. ED-17, No. 8, Aug. 1970, 9 pgs.

"A Complete High-Speed Voltage Output 16-Bit Monolithic DAC", Jimmy R. Naylor, IEEE Journal of Solid-State Circuits, vol. SC-18, No. 6, Dec., 1983, 7 pgs.

* cited by examiner

MODELING PROCESS FOR INTEGRATED CIRCUIT FILM RESISTORS

FIELD OF INVENTION

The present invention relates generally to semiconductor devices and more particularly to methods for modeling integrated circuit bar-shaped film resistors to account for self-heating.

BACKGROUND OF THE INVENTION

Thin film resistors are utilized in electronic circuits in many diverse technological applications. The resistors may be part of an individual device, or may be part of a complex hybrid circuit or integrated circuit. Some specific examples of thin film resistors in integrated circuits are the resistive ladder network in an analog to-digital converter, and current limiting and load resistors in emitter follower amplifiers.

Film resistors can comprise a variety of materials including polysilicon, tantalum nitride (TaN), silicon chromium (SiCr), and nickel chromium (NiCr), as well as other metals. These resistor materials are generally evaporated, sputtered, or CVD deposited onto a substrate wafer at a metal interconnect level and subsequently patterned and etched. The thin film resistors require an electrical connection to be made to them. Thus, two mask layers are required typically for fabrication: one to form the resistor film itself and the other to form the resistor "heads" or contact points of the resistor. Connection is then made typically from an overlying metal interconnect layer to the resistor heads.

High precision analog circuits rely heavily on the performance of passive circuit components such as resistors and capacitors. Consequently, it is advantageous to provide an accurate description of such components for their simulation in circuit simulation tools such as SPICE.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention provides a method for modeling bar-shaped thin film resistors accurately by accounting for resistance variations due to self-heating.

In accordance with one aspect of the present invention, a method of developing a resistance model of a bar-shaped thin film resistor (e.g., metal or polysilicon) is disclosed, wherein the model takes into account the impact of self-heating on the resistance of the structure. The method comprises designing and fabricating a plurality of thin film resistor test structures, wherein in one example the test resistors differ from one another in size. The test resistors are then characterized by measuring, for example, a width reduction parameter, a sheet resistance and a head resistivity associated therewith. The method further comprises measuring a temperature coefficient of the body and head portions of the resistor test structures. Lastly, a thermal resistance of the test structures is determined, wherein the thermal resistance characterizes the impact of self-heating to the resistance of the thin film resistor test structures. The collected data is then employed to generate a thin film resistor model.

In accordance with another aspect of the invention, the thermal resistance of the thin film structures is determined by measuring a voltage coefficient of the resistors. For example, the voltage coefficient is measured by varying an applied voltage across the test structures and measuring a change in resistance in response thereto. The portion of the voltage coefficient associated with the body of the thin film resistor structures is then distilled from the total voltage coefficient and used to determine fit parameters that characterize the thermal resistance thereof. In one example, an initial thermal resistance is assumed based on the thin film resistor geometry of the test structures, and a voltage coefficient of the body is based thereon (e.g., by calculating a voltage coefficient of the head and subtracting such value from the total voltage coefficient).

The body voltage coefficient data for the various, differently sized test structures is then analyzed and fit parameters are determined based on the data, wherein the fit parameters are then employed to calculate the actual thermal resistance. The process of calculating voltage coefficients using the new thermal resistance, determining new fit parameters, and calculating a new thermal resistance may be iterated one or more times, as may be desired. The resultant thermal resistance then serves as a parameters that may be employed within a thin film resistor model, and such model accounts for changes in resistance due to self-heating.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
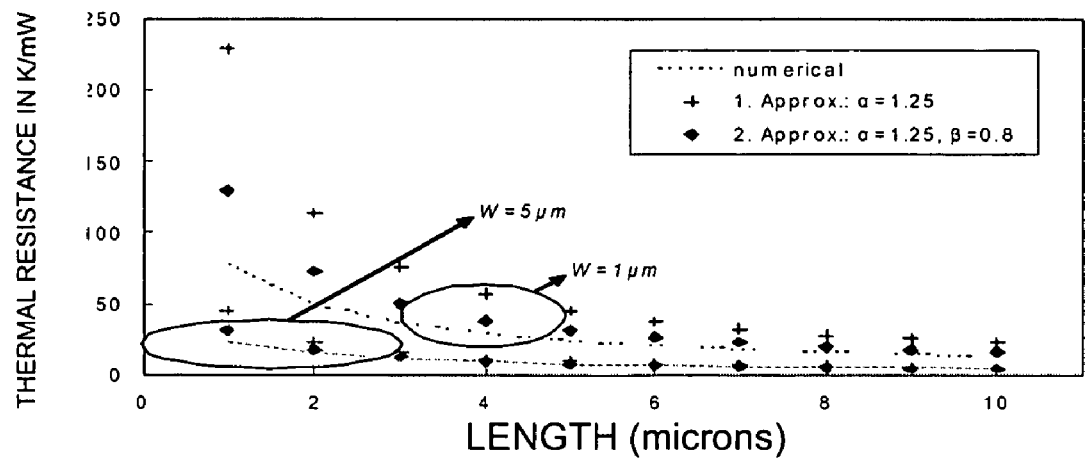
FIG. 1 is a graph illustrating thermal resistance plotted numerically and via fit parameter approximations for bar-shaped thin film resistors of varying geometry.

One or more implementations of the present invention will now be described with reference to the attached drawings, wherein like reference numerals are used to refer to like elements throughout. The invention relates to a method of developing a bar-shaped thin film resistor model that accounts for self-heating thereof.

As is generally known, the resistance of a resistor element may change in value based on the ambient temperature in which the resistor element resides. This characteristic of the resistor is often called the temperature coefficient of the element and is commonly reflected in models thereof for simulating the behavior of such elements in circuits over temperature. The resistance of such an element, however, may also vary due to other circuit characteristics, for example, due to stress placed on the resistor element. One common type of stress placed on a thin film type resistor is due to the self-heating of the resistor element when a voltage is applied thereacross, causing a current to conduct therethrough. This type of stress results in self-heating that impacts the resistance of the element itself, however, the parametric change due to such conditions is not presently accounted for in device models. Although only speculative, the inventors believe that failure to model this condition is likely due to belief that characterization of this behavior is difficult due to such behavior being a function of thin film resistor geometry as well as the surrounding environment of the device.

Self-heating is believed by the inventors of the present invention to be a significant cause for non-ohmic behavior in thin film resistors within semiconductor integrated circuits. Typically, power is dissipated by the resistor and transferred to the heat sink, which in such cases is the semiconductor substrate. Since the thermal coupling of the resistor to the heat sink is finite (particularly when the thin film resistor often reside over a modestly thermally insulative oxide or nitride layer (that is also electrically insulative)), the thin film resistor will heat up and change in resistance value according to its thermal resistance.

The temperature distribution associated with a thin film resistor may be described through the heat conduction equation:

$$\Delta(T) = -p/\lambda, \qquad \text{(equation (1))}$$

wherein $\Delta$ is the Laplace operator, T is the temperature distribution, p is the power density distribution, and $\lambda$ is the thermal conductivity distribution. The Laplace operator is linear, and since p is approximately constant and nonzero within the resistor where T is assumed to be constant, one can integrate and rewrite equation (1) as:

$$P = \Delta T/r_{th}, \qquad \text{(equation (2))}$$

wherein P is the total power dissipated in the resistor, $\Delta T$ is the temperature difference between the resistor and the heat sink, and $r_{th}$ is the proportionality factor, and is referred to as the thermal resistance. Thus $\Delta T$ reflects the self-heating of the thin film resistor due to the applied power, and the thermal resistance $r_{th}$ is a parameter that describes how much the thin film resistor will heat up (i.e., $r_{th}$ is a parameter that characterizes the self-heating of the thin film resistor).

From equation (2), the voltage coefficient of the body portion of the thin film resistor can be calculated:

$$\Delta R_b/R_b = \Delta T(T_{CR\_b}) = V^2 T_{CR\_b}(r_{th}/R_b) = V^2 V_{CR\_b}, \qquad \text{(equation (3))}$$

and thus, $$V_{CR\_b} = T_{CR\_b}(r_{th}/R_b), \qquad \text{(equation (4))}$$

wherein $V_{CR\_b}$ and $T_{CR\_b}$ are the voltage and temperature coefficients of the body of the resistor, V is the voltage drop across the body of the resistor, $R_b$ is the total resistance of the resistor body and $\Delta R_b$ is the absolute resistance change. In the model of the present invention, the quadratic component of the temperature coefficient of the thin film resistor is assumed to be negligible. Although such an assumption is not fully accurate for polysilicon type thin film resistors, because the self-heating temperature increase for poly resistors is reasonably small for typical applied voltages, a linear approximation for the temperature coefficient is considered reasonable.

Figure 4:
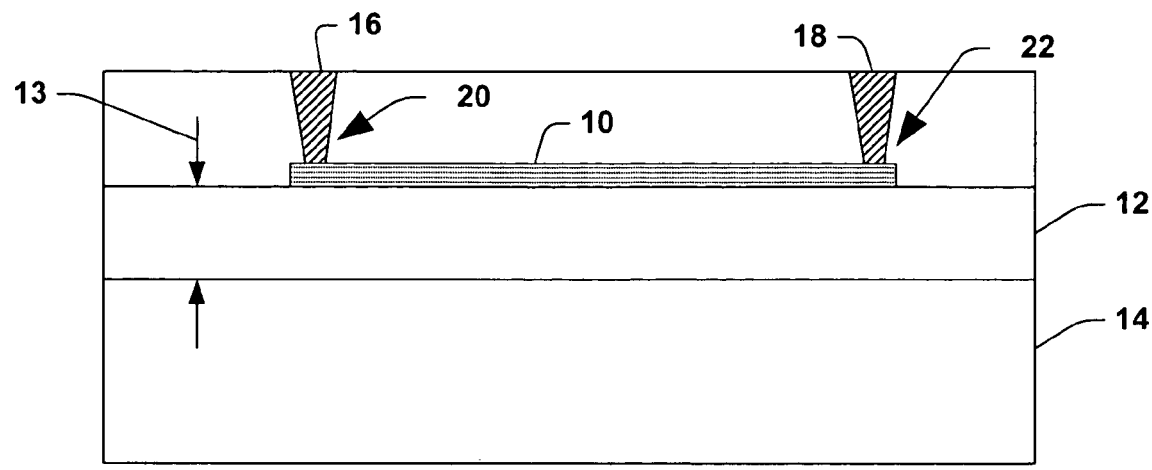
FIG. 4 is a sectional cross section view of a bar-shaped thin film resistor according to one aspect of the present invention.

The inventors of the present invention therefore have appreciated that to accurately characterize the self-heating experienced by the thin film resistor device during operation, the thermal resistance $r_{th}$ must be adequately characterized, and the method of the present invention accomplished such characterization. As stated above, the thermal resistance is a function of the resistor geometry as well as a function of the surrounding geometry; therefore $$r_{th} = f(z, L, W, H), \qquad \text{(equation (5))},$$

wherein z is the thickness of the insulator under the bar-shaped thin film resistor (see, e.g., FIG. 4 at reference numeral 13), and L, W, and H are the length, width and height of the bar-shaped thin film resistor, respectively.

To calculate $r_{th}$, equation (1) is solved. In one approximation, equation (1) is rewritten by applying the Gaussian theorem to obtain:

$$P = -\lambda \oint \vec{n} \nabla T d\,\Gamma, \qquad \text{(equation (6))}$$

wherein $-\nabla T$ is the temperature gradient between the resistor and the heat sink, n is the vector normal, and the integral extends over the surface $\Gamma$. If an assumption is made that the gradient between the resistor and the heatsink is constant, then $\Delta T/z$ is constant, and if the gradient from the top surface and peripheral surfaces is assumed to be negligible (i.e., all the heat travels downward from the bottom surface toward the heat sink), then equation (6) reduces to:

$$P = \lambda L W(\Delta T/z). \qquad \text{(equation (7))}$$

Thus, from equations (2) and (7), $r_{th}$ can be determined:

$$r_{th} = z/\lambda(LW). \qquad \text{(equation (8))}$$

Note that equation (8) relies on the assumption that no heat escapes from the top or periphery of the thin film resistor element. If the sheet resistivity $R_{sh}$ of the thin film resistor material, and the resistance $R_b$ of the body of the resistor is determined by $R_b = R_{sh}(L/W)$, then the voltage coefficient of the resistor body $V_{CR\_b}$ is:

$$V_{CR\_b} = T_{CR\_b} z/(\lambda R s L^2), \qquad \text{(equation (9))},$$

and thus $V_{CR\_b}$ is proportional to $1/L^2$, and thus is independent of the width of the resistor in this approximation. Simulations using the above model by the inventors of the present invention have yielded conclusions that the temperature gradient from the top of the device is not zero, but rather is some fraction of the bottom gradient, and such variation can be accounted for with a fit parameter $\alpha$ as follows:

$$P = \lambda \alpha L W(\Delta T/z). \qquad \text{(equation (10))}$$

For example, it was found that for a polysilicon film resistor overlying an oxide with a thickness z of about 0.4 micron, that the temperature gradient associated with the top of the resistor was about 25% that of the bottom, wherein $\alpha = 1.25$.

The above approximation of equations (8) and (10) yields a relatively simple formula for characterizing the thermal resistance $r_{th}$, and is contemplated in one aspect of the present invention. Depending, however, on a need for accuracy, such a model may not be sufficient. The above approximation, for example, assumes no periphery effect; that is, the model assumes that no heat is dissipated by the thin film resistor along the periphery thereof. Such an approximation may work for resistor geometries where W>>H, however, as thin film resistors continue to get smaller, such an approximation may prove insufficient for a desired level of accuracy. Such an accuracy will become more relevant as circuit dimensions shrink.

Accordingly, the inventors of the present invention contemplate a different approximation, wherein the temperature gradient on top of the device is assumed to be zero, since the thermal mass of the substrate is so large, however, the peripheral gradients are not assumed to be zero. Rather, an assumption is made that the peripheral gradients are identical to the vertical gradient below the resistor between the component and the heat sink. In such an instance, the heat conduction equation, when applying the Gaussian theorem can be calculated as:

$$P=\lambda(LW+2H(L+W))\Delta T/z. \qquad \text{(equation 11)}$$

Therefore the thermal resistance is:

$$r_{th}=z/\lambda(LW+2H(L+W)). \qquad \text{(equation (12))}$$

From equation (11), the voltage coefficient of the body can be calculated as:

$$V_{CR\_b}=WT_{CR\_b}z/[\lambda Rs((W+2H)L^2+2HWL)], \qquad \text{(equation (13))}$$

and thus $V_{CR\_b}$ is proportional to $W/(W+2H)L^2+2HWL)$. As can be seen in this second approximation or model, the voltage coefficient takes into account the width and height geometry of the film resistor as opposed primarily to the length as in the first approximation or model.

Figure 2:
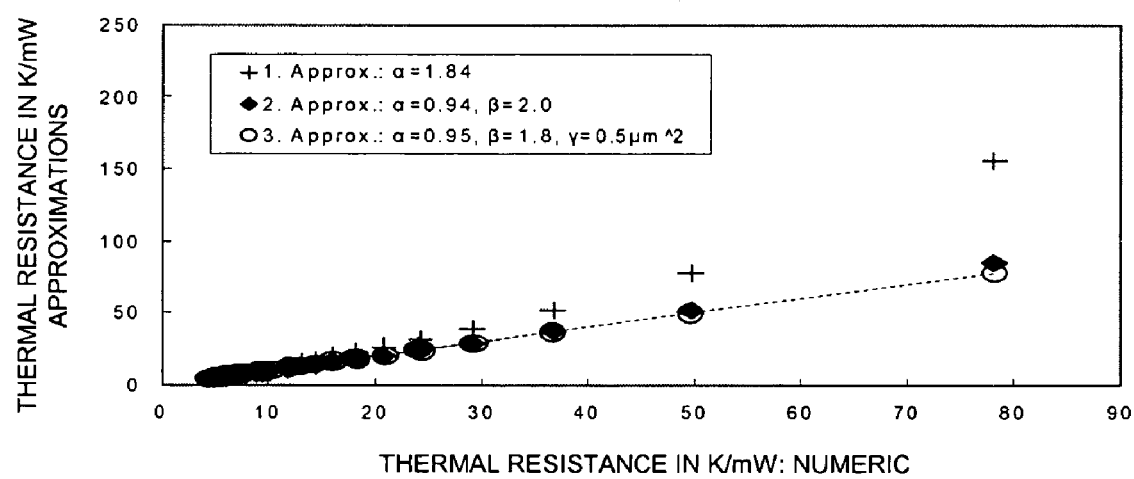
FIG. 2 is a graph illustrating calculated thermal resistance based on various approximations versus the thermal resistance calculated numerically for bar-shaped thin film resistors or varying geometry.

After solving equation (1) numerically, it has been found by the inventors of the present invention that the gradient associated with the periphery of the resistor is not the same as that of the bottom, so the difference can be accounted for (or mitigated) using another fit parameters β (a is again included to account for the top surface heat losses). In one example, for a polysilicon film resistor residing on an oxide layer of about 0.4 micron, the gradient on the resistor periphery was found to be about 80% of the gradient underneath, and thus in that case, the fit parameters β is about 0.8. Examples of how the fit parameters help account for variations caused by the assumptions made above are illustrated in FIGS. 1 and 2. In FIG. 1, thermal resistance is plotted for polysilicon thin film resistors with a z=0.4 micron, and an H=0.3 micron, and a W=5.0 microns and 1.0 micron, respectively (and varying lengths (L)). Note that the thermal resistance value calculated numerically (from the Gaussian theorem) deviates slightly from the values that would be expected using the fit parameters, particularly for small lengths.

As can be seen from the graph, thermal resistance decreases with both L and W, and this has to do with a better thermal coupling for larger resistors, since the heat can be transferred to the sink from a larger resistor surface. It can further be seen that for larger dimensions (e.g., L=10 microns and W=5.0 microns), either of the approximations come close to the numerical solution that does not employ any fit parameters. For narrower resistors, however, the first approximation exceeds the numerical solution, particularly if the length also becomes smaller. The second approximation is generally very close to the numerical solution, and only for very short, very narrow resistors is the error considerable.

In addition, FIG. 2 is a graph that illustrates calculated thermal resistance for polysilicon thin film resistors based on the approximations above versus the thermal resistance calculated numerically for resistors of varying dimension. Note that for approximations that use all three fit parameters, the agreement between the approximation and the numerical solution agrees considerably.

After further measurements were taken by the inventors of the present invention, and such data was compared to that predicted by the above model, it was found that the data could be further accommodated by another fit parameter γ that accounts for heat loss area through the heads of the resistor device. Thus the third fit parameter γ is not a function of the geometry of the resistor. Thus, the above equation can further be approximated as:

$$P=\lambda(\alpha LW+2\beta H(L+W)+\gamma)\Delta T/z. \qquad \text{(equation (14))}$$

And thus, $r_{th}$ is:

$$r_{th}=z/\lambda(\alpha LW+2\beta H(L+W)+\gamma). \qquad \text{(equation (15))}$$

The above approximations each may be used as a model for thin film resistors in circuit simulation tools to account for self-heating of the resistor under normal device operational stresses (e.g., due to applied voltages).

Figure 3:
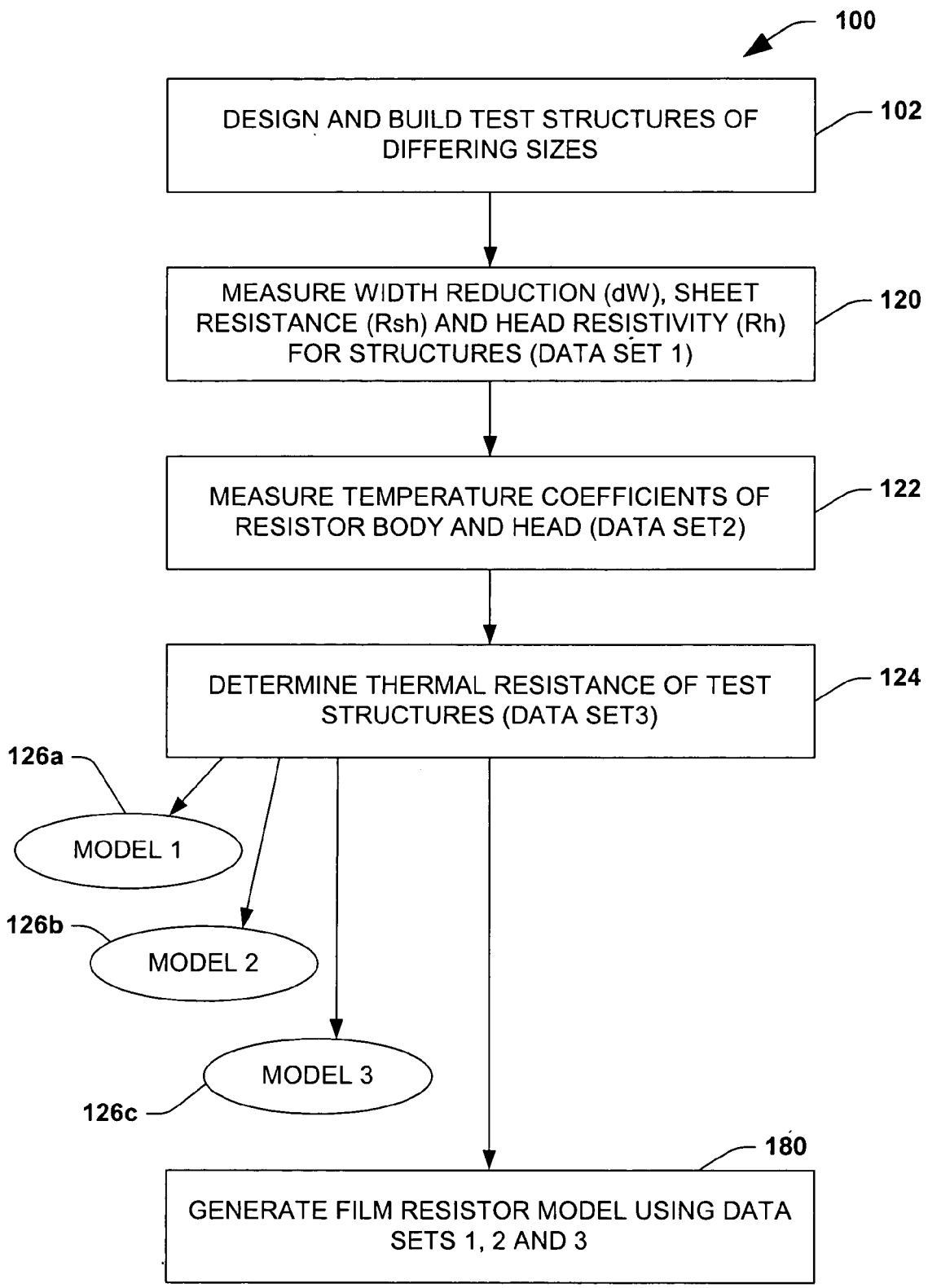
FIG. 3 is a flow chart illustrating a method of generating a thin film resistor model accounting for thermal resistance in accordance with the present invention.

In accordance with the above, a method of generating a model for bar-shaped (or dog bone-shaped) thin film resistors (e.g., metal or polysilicon) for use in circuit simulation tools that account for self-heating is disclosed, and is illustrated in FIG. 3 at reference numeral 100. While the method 100 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. The methods according to the present invention, moreover, may be implemented in association with the fabrication of devices illustrated and described herein as well as in association with other devices and structures not illustrated.

Figure 5:
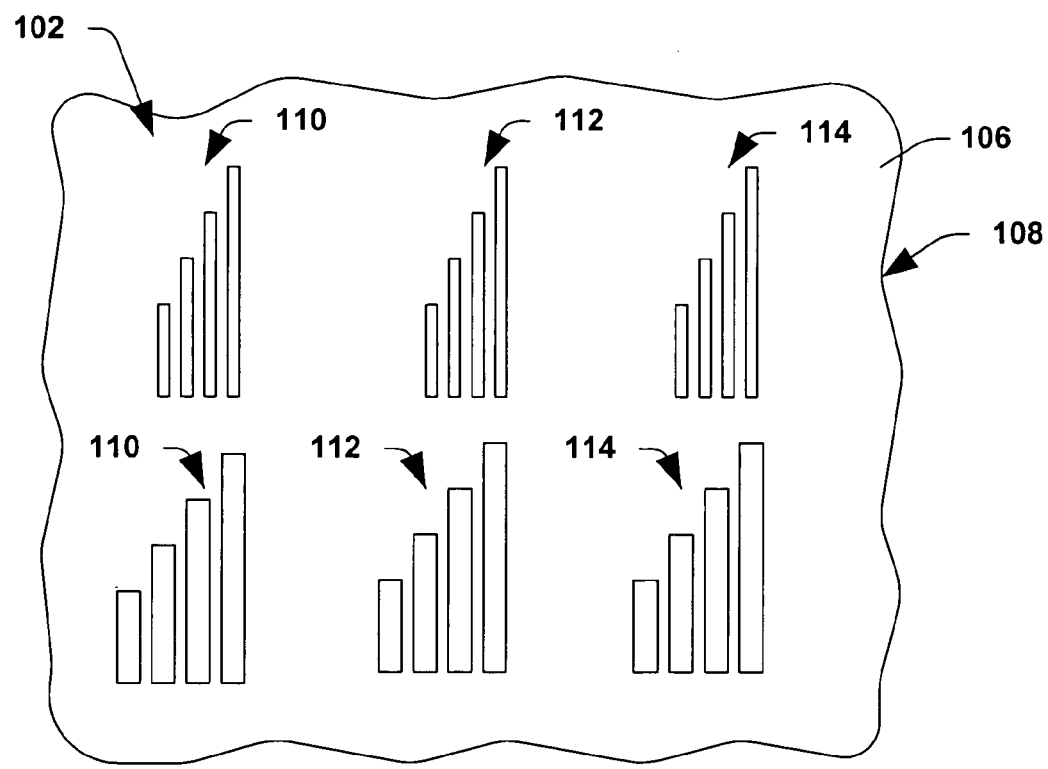
FIG. 5 is a top plan view illustrating a portion of a test die containing a plurality of differing bar-shaped thin film resistor types of varying dimension according to another aspect of the present invention.

The method 100 starts at 102, wherein a plurality of thin film resistors are designed and fabricated as test structures. The film resistors are formed in a manner similar to that illustrated in FIG. 4, wherein a thin film resistor 10 is formed over an insulating layer 12 having a known thickness 13 ("z") overlying a substrate 14. Contacts 16, 18 are made down to the resistor 10 at contact points 20, 22 that are the heads. The resistor 10 is formed having differing dimensions, for example, differing lengths and widths, as illustrated in FIG. 5. In FIG. 5, a plurality of resistors 102 reside over an insulating layer 106 on a substrate 108. The resistors 102 may be of different types, for example, a polysilicon resistor 110, a first metal type resistor 112, a second type metal resistor 114, etc. For each type resistor, multiple lengths (L) of a first thickness (W) are fabricated and such fabrication is repeated for varying widths, as illustrated.

After fabrication at 102 of FIG. 3, the method 100 continues at 120, wherein physical and electrical measurements of the resistors are made. For example, the actual width of the resistors are made, and the actual width is compared to the design width, with the difference being calculated as dW. In the above manner, the method 100 accounts for the variation in actual dimension based on the fabrication process being employed. The sheet resistance ($R_{sh}$ or $R_\square$) and head resistivity ($R_h$) for the test structures are further determined at 120 to generate a first data set (DATA SET 1).

Hereby the width reduction can be derived by extrapolating the widths of different resistors of equal lengths over their inverse resistance back to 1/R=0. Note that throughout this discussion W always denotes the physical width, that is the width reduction parameter having already been taken into account. In the next step, the sheet resistance ($R_{sh}$) can be measured in any of multiple known manners. For head resistivity, the resistances of varying lengths and identical width (W) can be employed and the resistances extrapolated back to L=0, with the residual resistance being the head resistance. The actual head resistivity can then be calculated by multiplying this extrapolated head resistance by the resistor width (W) and dividing the result by 2. This makes sense, since the actual head resistance will decrease for wider resistors where the actual head can be made physically wider.

As can be expected, the collected data will differ for the differing resistor types, and thus multiple, separate first data sets are collected to that each resistor type will be characterized using its own unique first data set. Alternatively, if only one type of thin film resistor is intended to be employed within a given fabrication process, the above process may be employed for only a single thin film resistor type and such variations are contemplated by the present invention.

The method 100 continues at 122, wherein the temperature coefficients of the resistors are measured. In accordance with one example, the temperature coefficients reflect the change in resistance experienced by the thin film resistors due to a change in the external ambient temperature. For example, a cell phone having integrated circuits therein may be exposed to substantial variations in temperature based on where the phone is used, and the temperature coefficients may be used to reflect variations in temperature to ensure that such circuits operate properly over such temperature ranges. In one example, the temperature coefficients of the thin film resistor test structures are measured at 122 by exposing the structures to differing ambient temperatures and measuring the resistance thereof across such temperatures. Such temperature coefficients can be taken for both the body of the resistors as well as the resistor heads by extrapolating the data for different lengths back to L=0 and evaluating the residual. Such temperature coefficient data is then collected and saved at 122 as a second data set (DATA SET 2).

The method 100 continues at 124, wherein the thermal resistance of the test structures is determined, using a model such as one of the three models discussed supra (126a–126c). For example, as set forth in equation (8), by using the first approximation, the thermal resistance is calculated based on the geometry of the element and the thickness of the oxide on which it resides, and such approximation is employed for model 1 (126a). Alternatively, equations (10) or (12) can be employed using fit parameters in accordance with a second model 126b. In yet another alternative, yet another fit parameter can be added to a model (e.g., in accordance with equation (15)) to determine the thermal resistance in accordance with a third model 126c. In any instance, the thermal resistance will be determined to some degree of accuracy and employed within a model for the thin film resistors. Previously, models did not account for thermal resistance, but the method 100 of the present invention advantageously does so. Consequently, the model will reflect changes in resistance due to self-heating thereof based on, for example, applied voltages during operation. Use of such a model will thus enable a designer to more accurately simulate actual circuit operation employing such thin film resistors.

Figure 6:
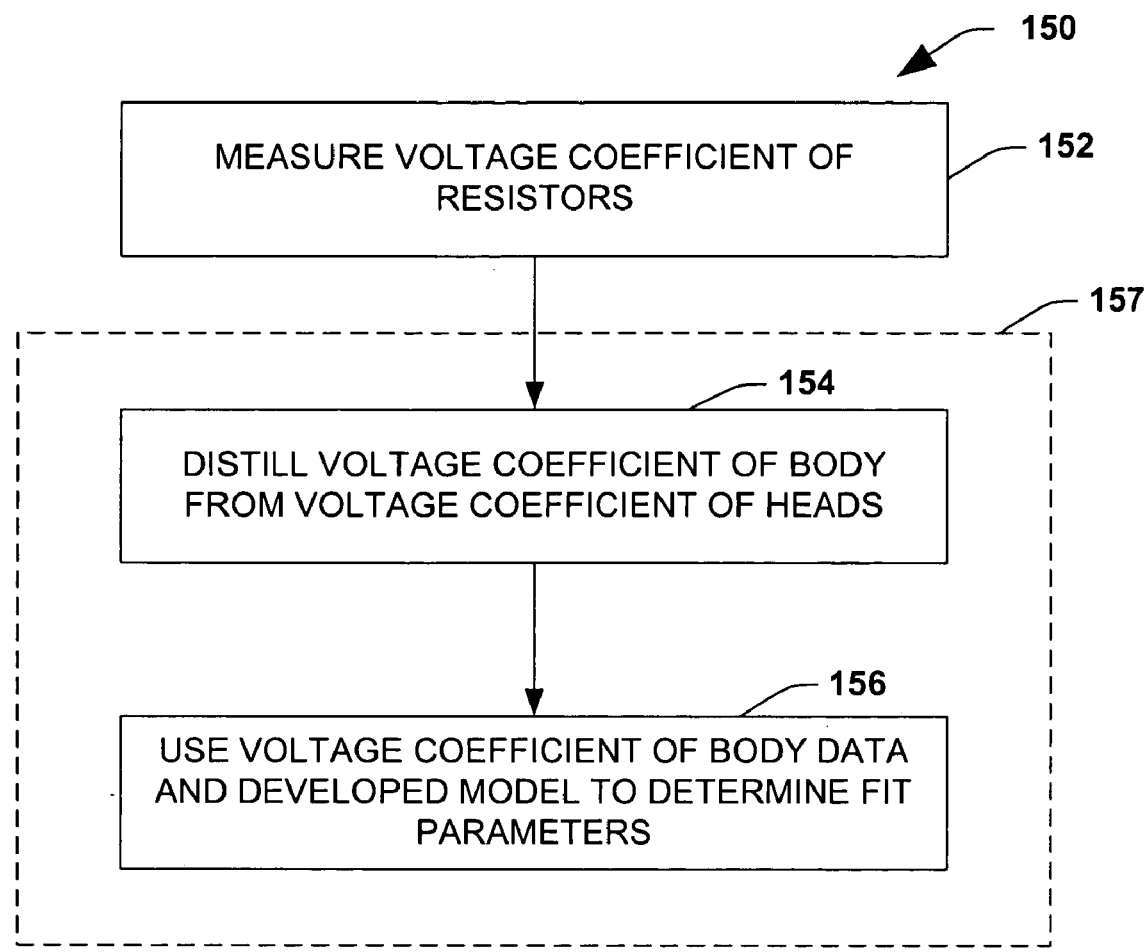
FIG. 6 is a flow chart illustrating a method of obtaining voltage coefficient data for use in characterizing thermal resistance of the thin film resistors of FIG. 5.

In one example, generating fit parameters in accordance with the models 2 and 3 (126b, 126c) can be obtained in accordance with 150 of FIG. 6. Initially, the voltage coefficients are measured for the multiple resistors at 152. For example, the voltage coefficients are obtained by applying a varying voltage across the thin film resistor and measuring the resistance thereof as a function of the varying voltage. In one example, the voltage is varied from a −V to a +V with data points omitted on or near the 0V point to avoid anomalous results thereat, although other procedures may be employed and are contemplated by the present invention. This will result in a total voltage coefficient ($V_{CR\_t}$) that comprises two components, the voltage coefficient associated with the resistor body ($V_{CR\_b}$) and the voltage coefficient associated with the resistor heads ($V_{CR\_h}$). Since the inventors of the present invention ascertained that self-heating applies primarily to the resistor body, the voltage coefficient of the body is separated from the voltage coefficient of the heads at 154. In one example, the above distillation is accomplished by calculating the voltage coefficient of the heads via a formula and subtracting it from the total voltage coefficient ($V_{CR\_t}$) to obtain the voltage coefficient of the body. The voltage coefficient of the body data is then used to determine the fit parameters at 156. The formula for ascertaining the voltage coefficient of the head is:

$$V_{CR\_h} = 2R_h T_{CRh} r_{th} / (R_{r0}^2 W), \qquad \text{(equation (16))}$$

wherein $R_{r0}$ is the total bar-shaped thin film resistor resistance without a voltage applied thereto. The voltage coefficient is found using an equation similar to equation (4):

$$V_{CR\_h} = T_{CR\_h} r_{th} / R, \qquad \text{(equation (17))}$$

wherein $$R = R_{r0}^2 / (2R_h / W). \qquad \text{(equation (18))}$$

These equations are obtained by starting with:

$$\Delta R_t = R_{sh}(L/W)T_{CR\_b}\Delta T + 2(R_h/W)T_{CR\_h}\Delta T. \qquad \text{(equation (19))}$$

Figure 7:
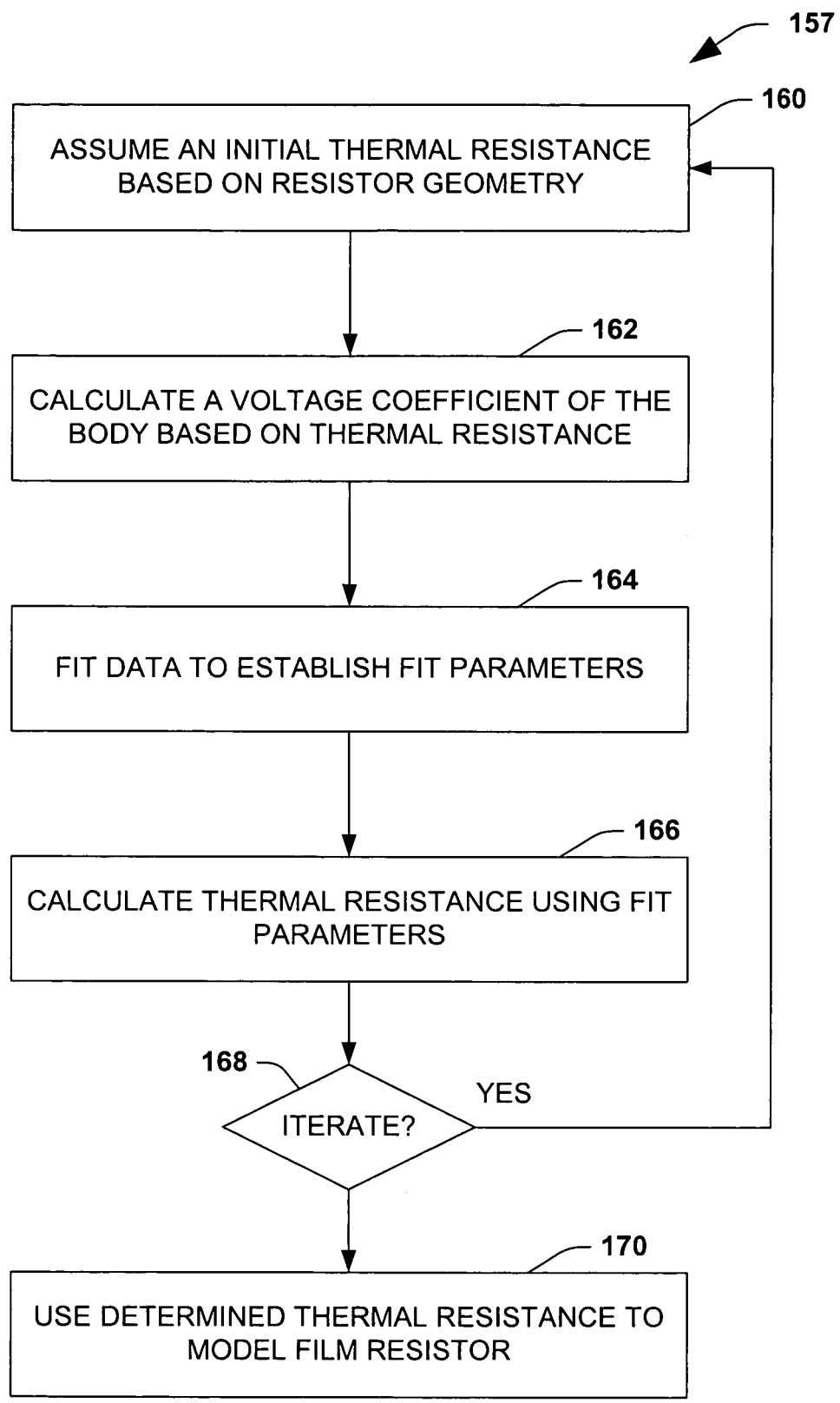
FIG. 7 is a flow chart illustrating a method of obtaining fit parameters for characterizing thermal resistance from the voltage coefficient data according to the present invention.

Plugging in $\Delta T = r_{th}(V^2/R_{r0})$ and dividing everything by $R_{r0}$, one obtains:

$$\Delta R_t / \Delta R_{r0} = R_{sh}(L/W)T_{CR\_b}(r_{th}V^2/R_{r0}^2) + 2(R_h/W)T_{CR\_h}(r_{th}V^2/R_{r0}^2), \qquad \text{(equation (20))}$$

wherein the second portion of the equation (20) is associated with the resistor head. Equation (16), however, includes $r_{th}$ that is at this time unknown (trying to be determined), so an iterative process 157 is employed, as illustrated, for example, in FIG. 7.

Initially, an initial thermal resistance ($r_{th}$) is assumed based on the resistor geometry. For example, equations (8) or (12) may be employed as an initial $r_{th}$ value at 160, and a voltage coefficient of the head ($V_{CR\_h}$) is calculated based on equation (16). This value is then subtracted from the total voltage coefficient ($V_{CR\_t}$) to obtain the voltage coefficient of the body ($V_{CR\_b}$) at 162. This calculation is done for all resistor sizes (and, if desired, for each type of resistor) to obtain a $V_{CR\_b}$ that is a function of resistor geometry ($V_{CR\_b} = f(W, L)$).

Now that the voltage coefficient data associated with the body is known, the following formula (that is obtained in a manner similar to equation (13), by multiplying equation (4) with equation (15) and renaming the coefficients in front of W and L, respectively) is assumed to hold:

$$V_{CR\_b} = W\alpha_p / ((W+\beta_p)L^2 + (W\beta_p + \gamma_p)L). \quad \text{(equation (21))}$$

Using the $V_{CR\_b}$ data obtained above, a curve-fitting is employed in which the parameters $\alpha_p$, $\beta_p$, $\gamma_p$ are varied until a best fit is reached. As criterion one can use the average relative difference of measured values from the formula. Other criteria or algorithms are conceivable like, for example, a least square algorithm. Using these parameters $\alpha$, $\beta$, and $\gamma$ are extracted at 164 according to the formulas:

$$\alpha = T_{CR\_b} z / \lambda \alpha_p R_{sh} \quad \text{(equation (22))}$$

$$\beta = \alpha \beta_p / 2H \quad \text{(equation (23))}$$

$$\gamma = \alpha \gamma_p \quad \text{(equation (24))}$$

Note that $\alpha_p$, $\beta_p$ and $\gamma_p$ are the fit parameters directly associated with the voltage coefficient data (equation (21)), and equations (22)–(24) are employed so that the thermal resistance equation (15) is more readable.

The thermal resistance is then recalculated at 166 using the extracted fit parameters according to equation (15) discussed supra. A query is then made at 168 whether an iteration should be made at 168. If lesser accuracy is acceptable, the $r_{th}$ calculated with one pass as described above may be sufficient; however, the process can iterate at 168 where in a new $r_{th}$ can be calculated at 160 and the $V_{CR\_b}$ is then calculated at 162 and new fit parameters are obtained and used to generate a new $r_{th}$ at 166. Iteration at 168 can terminate based on, for example, a predetermined number of iterations or a change in the fit parameters or the resulting rth being less than a predetermined threshold (a predetermined level of convergence). Once the iteration process is complete at 168, the thermal resistance ($r_{th}$) for the given thin film resistor type is determined and can be used at 170 to obtain a model that contemplates self-heating.

Although the above model example employs voltage or current coefficients to ascertain the thermal resistance, alternative methods may be employed in accordance with the present invention. For example, a metal line may be formed across each resistor, and then temperature coefficients of the metal lines are determined, and in that way each metal line acts as a thermometer. Then one can force a defined power through each resistor and the temperature increase is measured and the thermal resistance is calculated by dividing the measured temperature increase by the power.

Returning to FIG. 3, a thin film resistor model is generated at 180 using the data from data sets (e.g., 1, 2 or 3, or a combination thereof). That is, a model is generated that takes into account the resistor geometry, its temperature coefficient and its thermal resistance ($r_{th}$). In one example, the resultant thin film resistor model is:

$$R_t = R_{sh} L/(W - dW)(1 + T_{CR\_b}[T + |Vr_{th} - T_0]) + 2R_h/(W - dW)(1 + T_{CR\_h}[T + |Vr_{th} - T_0]), \quad \text{(equation (25))}$$

wherein the first term is associated with the body, and the second term is associated with the heads, and both terms account for self-heating with the thermal resistor term ($r_{th}$) obtained as discussed above.

Note that in the discussion above, R is always the large scale resistance (V/I) and not the small scale resistance (dV/dI). In addition, it should be noted that the modeling of the present invention also holds for conditions in which a heat sink resides over the thin film resistor.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of modeling a thin film resistor in an integrated circuit, comprising:

fabricating the thin film resistor over a substrate and a dielectric;

characterizing a thermal resistance of the thin film resistor, wherein the thermal resistance accounts for self-heating thereof during operation; and using the thermal resistance in a model for use in simulating integrated circuits using the thin film resistor;

wherein characterizing the thermal resistance of the thin film resistor comprises:

measuring dimensions of the thin film resistor;

calculating an approximation of the thermal resistance using the measured dimensions; and wherein calculating the approximation of the thermal resistance comprises calculating the thermal resistance according to the formula:

$$r_{th} = z / \lambda \alpha L W,$$

wherein $r_{th}$ is the thermal resistance, z is a thickness of an electrically insulating layer overlying the substrate on which the thin film resistor resides, $\lambda$ is the thermal conductivity distribution associated with the thin film resistor, and L and W is the length and width of the thin film resistor, respectively, and $\alpha$ is a fit parameter that accounts for a temperature gradient associated with a top portion of the thin film resistor being nonzero.

2. A method of modeling a thin film resistor in an integrated circuit, comprising:

fabricating the thin film resistor over a substrate and a dielectric;

characterizing a thermal resistance of the thin film resistor, wherein the thermal resistance accounts for self-heating thereof during operation; and using the thermal resistance in a model for use in simulating integrated circuits using the thin film resistor;

wherein characterizing the thermal resistance of the thin film resistor comprises:
    measuring dimensions of the thin film resistor;
    calculating an approximation of the thermal resistance using the measured dimensions; and
    wherein calculating the approximation of the thermal resistance comprises calculating the thermal resistance according to the formula:

$$r_{th}=z/\lambda(LW+2H(L+W)),$$

wherein $r_{th}$ is the thermal resistance, z is a thickness of an electrically insulating layer overlying the substrate on which the thin film resistor resides, $\lambda$ is the thermal conductivity distribution associated with the thin film resistor, and L, W and H are the length, width and height of the thin film resistor, respectively.

3. A method of modeling a thin film resistor in an integrated circuit, comprising:
    fabricating the thin film resistor over a substrate and a dielectric;
    characterizing a thermal resistance of the thin film resistor, wherein the thermal resistance accounts for self-heating thereof during operation;
    using the thermal resistance in a model for use in simulating integrated circuits using the thin film resistor;
    fabricating a plurality of thin film resistors of the same type, wherein the plurality of thin film resistors have varying dimensions associated therewith; and
    wherein characterizing the thermal resistance of the thin film resistor comprises:
        extracting the fit parameters using the voltage coefficient data according to the formula:

$$r_{th}=z/\lambda(\alpha LW+2\beta H(L+W)+\gamma)$$

wherein alpha, beta and gamma comprise the fit parameters.

4. The method of claim 3, wherein a comprises a fit parameter that accounts for a temperature gradient associated with a top portion of the thin film resistors being nonzero, $\beta$ accounts for the temperature gradient associated with the peripheral portions of the thin film resistors being different than the temperature gradient associated with bottom portions thereof, and $\gamma$ is a fit parameter that accounts for heat loss area associated with head portions of the thin film resistor.

5. A method of modeling a thin film resistor in an integrated circuit, comprising:
    fabricating the thin film resistor over a substrate and a dielectric;
    characterizing a thermal resistance of the thin film resistor, wherein the thermal resistance accounts for self-heating thereof during operation; and
    using the thermal resistance in a model for use in simulating integrated circuits using the thin film resistor;
    fabricating a plurality of thin film resistors of the same type, wherein the plurality of thin film resistors have varying dimensions associated therewith; and
    wherein characterizing the thermal resistance of the thin film resistor comprises:
        measuring a current coefficient of the plurality of thin film resistors, thereby resulting in current coefficient data that reflects a change in resistance of the thin film resistors based on variations in current conducting therethrough; and
        using the current coefficient data to extract fit parameters to characterize the thermal resistance, wherein the fit parameters account for temperature gradients associated with a top portion, peripheral portion, and bottom portion of the thin film resistor.

6. A method of modeling a bar-shaped thin film resistor, comprising:
    forming a plurality of thin film resistors of differing sizes;
    measuring a voltage or current coefficient of the plurality of thin film resistors;
    determining a thermal resistance based on the measured voltage or current coefficients; and
    wherein measuring the voltage coefficient comprises:
        distilling body voltage coefficient data from head voltage coefficient data in the measured voltage coefficients; and
        using the body voltage coefficient data to determine one or more fit parameters for a thermal resistance model.

7. The method of claim 6, wherein determining the thermal resistance comprises:
    assuming an initial thermal resistance value;
    using the assumed initial thermal resistance value to distill body voltage coefficient data from the measured voltage coefficients;
    determining one or more fit parameters from the body voltage coefficient data; and
    using the determined fit parameters to calculate a new thermal resistance value.

8. The method of claim 7, further comprising:
    (a) using the new thermal resistance value to distill new body voltage coefficient data from the measured voltage coefficients;
    (b) determining new fit parameters from the new body voltage coefficient data; and
    (c) using the new fit parameters to calculate an updated thermal resistance value.

9. The method of claim 8, further comprising repeating the actions (a), (b) and (c) until the current new fit parameters differ from a previous set of fit parameters by a predetermined amount or less.

10. The method of claim 8, further comprising repeating the actions (a), (b) and (c) a predetermined number of times.

11. The method of claim 7, wherein determining the one or more fit parameters comprises:
    calculating a voltage coefficient of the head for each of the plurality of thin film resistors using the initial assumed thermal resistance according to the formula:

$$V_{CR\_h}=2R_h T_{CR\_h} r_{th}/(R_{t0}W),$$

wherein $V_{CR\_h}$ is the voltage coefficient of the head, $R_h$ is the head resistance, $T_{CR\_h}$ is the temperature coefficient of the head, $r_{th}$ is the initial assumed thermal resistance, $R_{t0}$ is a total resistance without a voltage applied thereto, and W is a width of the thin film resistor.

12. The method of claim 11, further comprising subtracting the voltage coefficient of the head from the voltage coefficient for each of the plurality of thin film resistors to obtain the voltage coefficient of the body for each of the thin film resistors.

13. The method of claim 12, calculating fit parameters using the voltage coefficient of the body data according to the formula:

$$V_{CR\_b}=W\alpha_p/((W+\beta_p)L^2+(W\beta_p+\gamma_p)L),$$

wherein $V_{CR\_b}$ is the voltage coefficient of the body and $\alpha_p$, $\beta_p$, and $\gamma_p$ comprise preliminary fit parameters.

14. The method of claim 13, wherein the one or more fit parameters are calculated by:

$$\alpha=T_{CR\_b}z/\lambda\alpha_p R_{sh},\ \beta=\alpha\beta_p/2H\text{ and }\gamma=\alpha\gamma_p,$$

wherein $\alpha$ comprises a fit parameter that accounts for a temperature gradient associated with a top portion of the thin film resistors being nonzero, $\beta$ accounts for the temperature gradient associated with the peripheral portions of the thin film resistors being different than the temperature gradient associated with bottom portions thereof, and $\gamma$ is a fit parameter that accounts for heat loss area associated with head portions of the thin film resistor.

* * * * *